United States Patent
Heo et al.

[11] Patent Number: 6,057,698
[45] Date of Patent: May 2, 2000

[54] TEST SYSTEM FOR VARIABLE SELECTION OF IC DEVICES FOR TESTING

[75] Inventors: Kyeong Il Heo; Tae Lyun Kim, both of Asan, Rep. of Korea

[73] Assignee: Samsung Electronics Co., Ltd., Suwon, Rep. of Korea

[21] Appl. No.: 08/966,532

[22] Filed: Nov. 10, 1997

[30] Foreign Application Priority Data

Nov. 12, 1996 [KR] Rep. of Korea ............ 96-53476
Jul. 11, 1997 [KR] Rep. of Korea ............ 97-32280
Oct. 10, 1997 [KR] Rep. of Korea ............ 97-51931

[51] Int. Cl.[7] .................................................. G01R 31/00

[52] U.S. Cl. ........................................ 324/765; 324/760

[58] Field of Search ............................. 324/765, 760, 324/72.5, 158.1; 438/14, 15, 17, 18; 257/40, 48; 714/724, 32

[56] References Cited

U.S. PATENT DOCUMENTS 4,922,184  5/1990  Rosenstein et al. ............... 324/72.5
5,473,259  12/1995 Takeda ................................ 324/760
5,880,592  3/1999  Sharpes et al. ..................... 324/760

*Primary Examiner*—Jossie Ballato
*Assistant Examiner*—Minh Tang
*Attorney, Agent, or Firm*—Jones Volentine, LLP

[57] ABSTRACT

A test system for detecting integrated circuit (IC) devices having a short life time. The test system thermally, electrically and functionally tests the IC devices. The test system includes a selection signal generator with a memory device for writing external data into memory cells indicated by address signals and for reading the written external data as device selection signals. A counter sequentially increases the address signals entering into the memory device. The device selection signal patterns can be adjusted according to standard memory test patterns or user defined test patterns.

12 Claims, 3 Drawing Sheets

TEST SYSTEM FOR VARIABLE SELECTION OF IC DEVICES FOR TESTING

BACKGROUND OF THE INVENTION

1. Field of the Invention

The present invention generally relates to testing technology for semiconductor integrated circuit devices, and more particularly, to a burn-in test system which can select IC devices at any location on a test board depending on the test patterns or the choice of the operator.

2. Description of the Related Art

Most semiconductor IC device failures occur within the first one thousand hours after they are produced. If failures or defects are not found during that initial time period, the IC devices are believed to be reliable and are delivered to customers for installation in a system. In order to screen out the defective devices that have a short life span, IC device manufacturers perform a burn-in test which environmentally (thermally and/or electrically) stresses the IC devices to accelerate any failures or defects resident in the device.

The burn-in tests are performed on packaged IC devices, and can be divided into three types; a static burn-in test, a dynamic burn-in test, and a monitor burn-in test.

During static burn-in tests, only power supply signals are supplied to the devices while thermal stress is being applied. The static burn-in test is mainly used to test linear devices and logic devices.

The dynamic burn-in test is performed by providing a power source, several electrical signals, and data for the devices so that electrical stress as well as thermal stress can be applied to the devices to simulate real-life operation conditions. The dynamic burn-in test is generally suitable for testing memory devices.

In the monitor burn-in test, the acceleration of early failures is achieved by thermally and electrically stressing the devices, accompanied by a functional test that measures output signals from the devices. Once the devices are loaded into a test system or test board, they can be exercised or tested under a variety of stresses, whereby their proper function and operation can be verified without removing them from the burn-in test board. Therefore, it is possible to reduce the total test time and to optimize the test time. Presently, the monitor burn-in is mainly used to test memory devices, and thus is usually called "Memory Burn-In".

The monitor burn-in test uses test boards where many (e.g., 128) IC devices to be tested are mounted. The test board is then inserted into an oven or a chamber which comprises a temperature controller for subjecting the devices to an increased temperature condition for accelerating their early failure. For electrically stressing the devices, terminals of the devices are connected in parallel to signal supply pins of a test system, where increased voltage and high current are supplied to the devices. The thermal and electrical stress applications can be performed at one time on all the devices mounted on the test board, even when the number of the input/output pins of the test system is limited. However, when performing the functional test portion of the monitor burn-in, the different input/output pins of the test system must be connected to the output terminals of the devices. Accordingly, the monitor burn-in system uses scanning signals for selecting particular devices mounted on the test board, but in the conventional system only one or two devices are selected at the same time by the scanning signals.

The specific number of devices selected by the scanning signals varies, and is determined with reference to the number of data bits of the output signals from the device and total data input pins of the test system. For example, if the number of data input pins is 'm' and the output signals have 'a' bits, the maximum number of the selected devices would be 'b', with the relationship m=a×b or b=m/a. If only a small number of devices are selected at one time for functional testing, the testing process time increases and the efficiency of the monitor burn-in test decreases.

The device selection problem is particularly pertinent when devices that operate in both merged data output mode and normal standard mode are tested using a single test board as described in U.S. Pat. application Ser. No. 08/967, 016, filed Nov. 10, 1997, entitled "TEST BOARD FOR TESTING IC DEVICES OPERATING IN MERGED DATA OUTPUT MODE OR STANDARD MODE" (Attorney Docket No. SEC.351), which is hereby incorporated by reference its entirety.

A need exists, therefore, for a test system where the selection pattern for the devices is not fixed, but rather is flexible or adjustable to various test patterns so that devices at any location on the test board can be selected depending on the test patterns and/or the operator's choice.

SUMMARY OF THE INVENTION

It is an object of the present invention to provide a test system which can select IC devices at any location on a test board depending on the test patterns and/or the operator's choice.

It is another object of the present invention to reduce the burn-in test time and improve the efficiency of the burn-in test.

To achieve these and other objects, the present invention provides a test system for detecting integrated circuit device failures, the test system comprising: a chamber containing a test board, the chamber having a temperature controller for controlling a temperature within the chamber for applying thermal stress to a plurality of integrated circuit (IC) devices which are mounted onto the test board; a test pattern generator for applying electrical stress to the IC devices and for producing a predetermined test pattern to test functions of the IC devices; a data driver/receiver for supplying data to the IC devices and for receiving output data from the IC devices; a data checking unit for checking whether the output data received by the data driver/receiver has a correct value; a selection signal generator for producing selection signals to select the IC devices for testing, wherein at least two of the IC devices mounted on the test board are randomly selected depending on the predetermined test pattern generated by the test pattern generator; and a controller for controlling operations of the temperature controller, the test pattern generator, the data driver/receiver, the data checking unit, and the selection signal generator.

The selection signal generator comprises a memory device for writing external data into its memory cells indicated by address signals and providing the written external data as device selection signals to the test board, and a counter for sequentially increasing the address signals.

With the present invention, it is possible to produce selection signal patterns suitable for use in testing IC devices that operate in both a merged data output mode and a standard normal mode using a single test board.

BRIEF DESCRIPTION OF THE DRAWINGS

The above objects and advantages of the present invention are described further below, with reference to the accompanying drawings in which.

DETAILED DESCRIPTION OF THE PREFERRED EMBODIMENT

Figure 1:
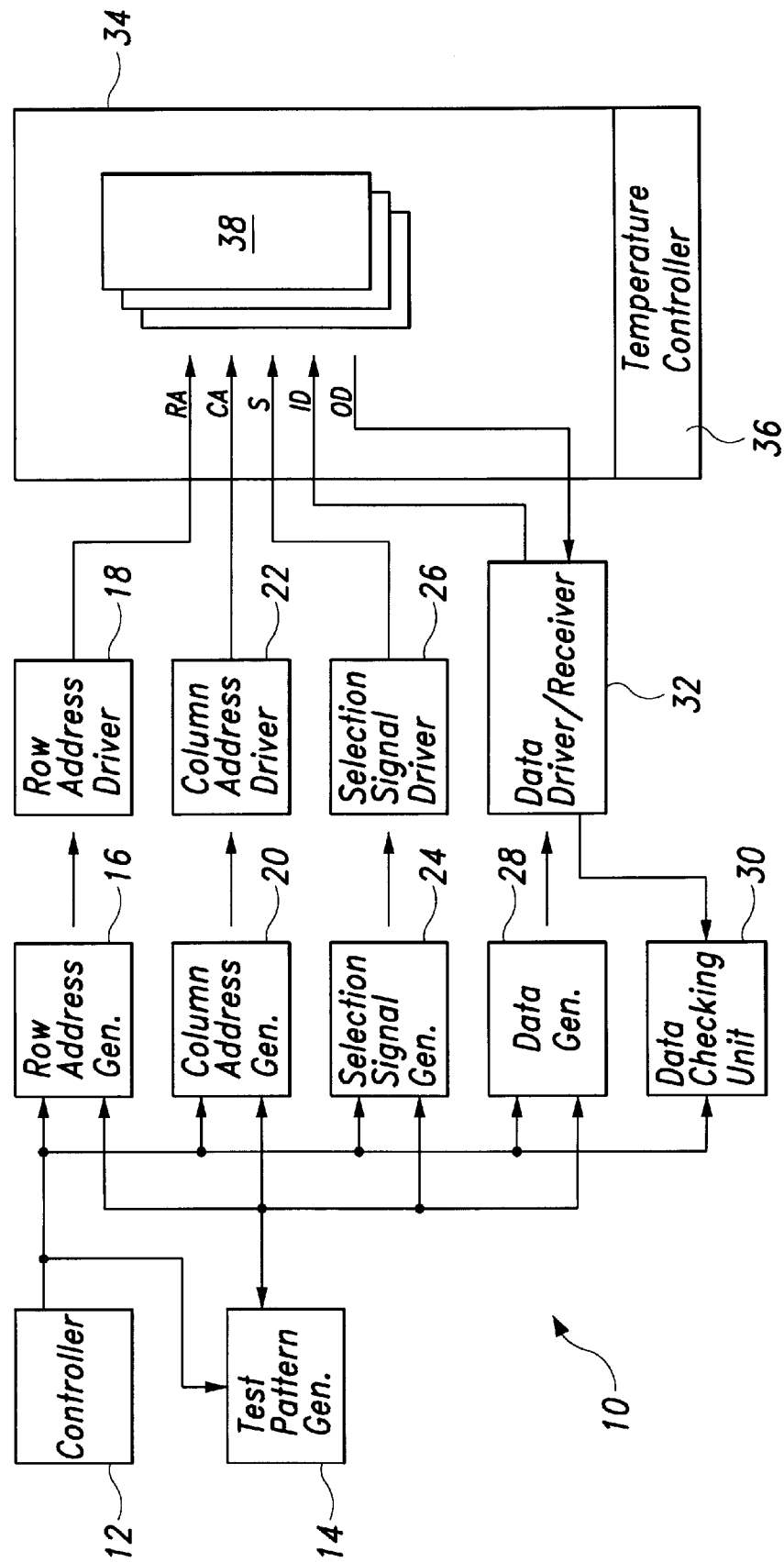
FIG. 1 is a schematic diagram of a burn-in test system of the present invention.

Referring to FIG. 1, a test system 10, which is suitable for the monitoring burn-in test process, generally comprises a chamber 34 and a temperature controller 36 for thermally stressing the devices under test, and several circuit modules for delivering electrical signals to the devices and for receiving and measuring the output signals from the devices.

A controller 12 acts as a system controller, providing test system supervision and peripheral device management. With controller 12 an operator can control device timing, environmental chamber temperatures, voltage settings for the devices, data pattern selection/formatting, and addressing sequences. A test pattern generator 14 is controlled by the controller 12 and generates and executes standard memory test patterns as well as test patterns defined by user. The test pattern generator 14 in turn generates and controls a microprogram address, which is transmitted to a selection signal generator 24, row address generator 16, column address generator 20, and data generator 28. The row address generator 16, column address generator 20, and data generator 28 execute microcode instructions responsive to the address from the test pattern generator 14.

The row address generator 16 and column address generator 20 respectively produce row address (RA) signals and column address (CA) signals for addressing the devices (not shown) mounted on a test board 38. The row address signals and column address signals are delivered to the devices through the row address driver 18 and the column address driver 22, respectively.

The selection signal generator 24 generates selection signals or scanning signals (S) which are delivered to the devices through a selection signal driver 26. The selection or scanning signals are used to choose the devices mounted on the test board 38 for testing.

The data generator 28 executes micro instructions of the test pattern generator 14 to produce input data (ID) (of a maximum of 32 bits, for example) and sends the input data to the devices through the data driver/receiver 32. The input data is also sent to a data checking unit 30 for use as reference values to check the output data (OD) from the selected devices.

The output data (OD) from the selected devices are received by the data driver/receiver 32 and measured by the data checking unit 30 to determine that the devices are operating normally.

The data checking unit 30 has the capability to process and store information regarding failing devices. The failure information may constitute failing data bits for each failing device, or it may contain a device cell address and failing device location as well as the failing data bits. The failure information is then sent to the controller 12 for analysis and display.

The selection signals (scanning signals) passing through the selection signal driver 26 have various patterns depending on the test pattern generated by the test pattern generator 14 and the test patterns defined by the user through the controller 12.

In the chamber 34, many (e.g., 128) IC devices (not shown) are mounted on the test board 38. The temperature within the chamber 34 is determined by the temperature controller 36 which is also controlled by the system controller 12.

Figure 2:
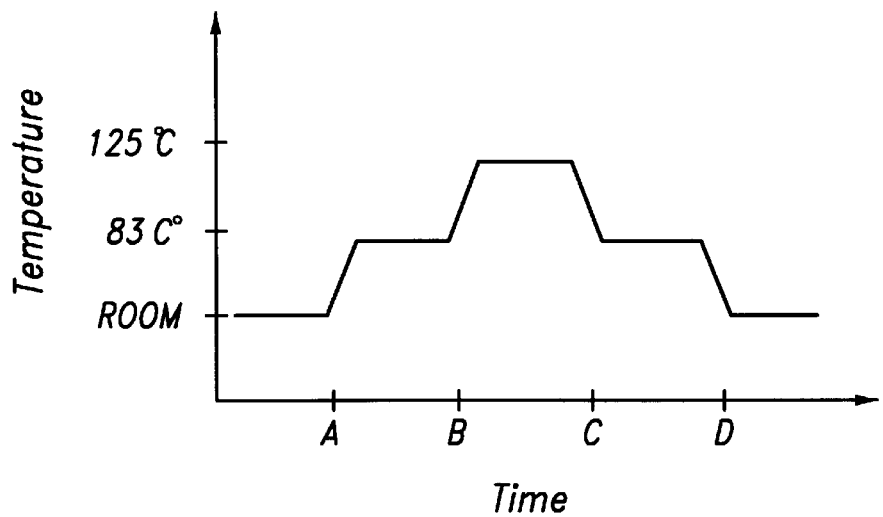
FIG. 2 is a graph showing temperature variation over time when applying a thermal stress to a device to be tested by the burn-in test system of the present invention.

FIG. 2 shows an exemplary temperature variation within the chamber 38. Referring to FIG. 2, the chamber temperature is initially maintained at room temperature (from the start to time A). The temperature is rapidly increased to 83° C. (time A-B) for thermally stressing the devices. During this time period, electrical stress is also applied to the devices through the data driver/receiver 32 so that the early failures can be accelerated. Then, the functional test is performed to check whether the devices failed or not. At the next burn-in cycle (time B-C), the temperature is raised to 125° C. for further stressing the devices, and electrical stressing and functional testing are performed again. Next, the temperature is returned to 83° C. (time C-D) to again perform electrical stressing and functional testing. Finally, the temperature is returned to room temperature (after time D).

Figure 3:
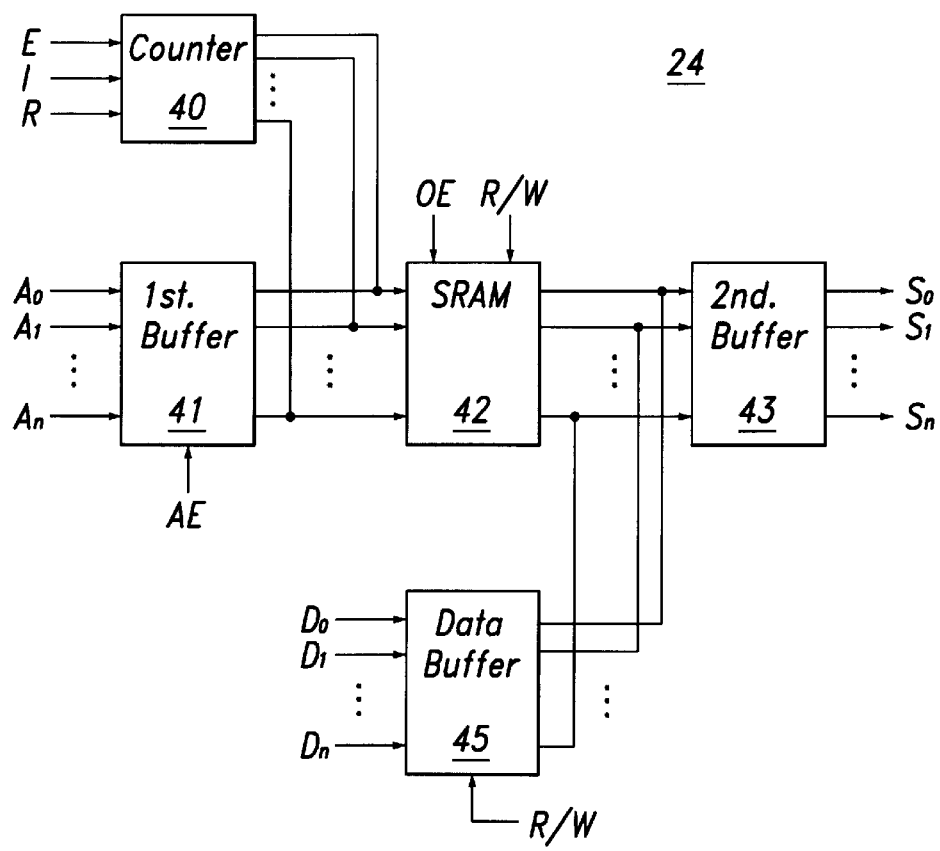
FIG. 3 is a block diagram of a selection signal generator according to the present invention.

FIG. 3 shows an exemplary selection signal generator 24 suitable for use in the test system 10 of the present invention. A counter 40 is enabled by receiving an enable signal E and is returned to its initial state upon receiving a reset signal R. The output of the counter 40 is sequentially increased whenever an increment signal I is received.

The control signals E, I, and R for the counter 40 are provided from the controller 12 of the test system 10.

The first buffer 41 is enabled by receiving an address enable signal AE which allows the address signals $A_0, A_1, \ldots A_n$ to be recognized by a memory device such as a SRAM 42 (Static Random Access Memory). The address signals $A_0, A_1, \ldots A_n$ may be supplied to the first buffer 41 by either the test pattern generator 14 or the controller 12 of the test system 10. The n+1 bit output signals of the first buffer 41 are connected one-to-one to the output terminals of the counter 40, so that it is possible to sequentially increase the address signals entering the SRAM 42.

The SRAM 42 writes data signals $D_0, D_1, \ldots D_n$ as device selection signals to memory cells indicated by the address signals $A_0, A_1, \ldots A_n$. The output data of the SRAM 42 are delivered to the second buffer 43 which provides the device selection signals $S_0, S_1, \ldots S_n$ that are sent to the test board 38. A data buffer 45 is controlled by a read and write control signal R/W. During the write operation mode of the data buffer 45, data signals $D_0, D_1, \ldots D_n$ are written to and stored in the SRAM 42, while in the read operation mode of the data buffer 45, the stored data in the SRAM 42 is checked to confirm that the correct data bits are written in the address memory locations. The data signals $D_0, D_1, \ldots D_n$ are provided by the controller 12 of the test system 10.

More specifically, when writing the device select data into the SRAM 42, the data buffer 45 and the SRAM 42 receive the write signal W while the output enable signal OE of the SRAM 42 is disabled. At this time, the output of the counter 40 remains in a high impedance state, so that the counter 40 has no effect on the address signals for the SRAM 42. When the address enable signal AE is input to the first buffer 41 for addressing the SRAM 42, the address signals $A_0, A_1, \ldots A_n$ select memory cells in the SRAM 42 and the data signals $D_0, D_1, \ldots D_n$ are written to the selected memory cells.

When the read signal R and the output enable signal OE are input to the SRAM 42, the written data signals are outputted to be used as the device selection signals $S_0, S_1, \ldots S_n$. At this time, the enable signal E is delivered to the counter 40, so that the address signals for the SRAM 42 are determined by the output signals of the counter 40. The address is sequentially increased whenever the increment signal I is input, and thus the output data of the SRAM 42 is varied. Accordingly, it is possible to randomly select the devices mounted on the test board 38 to be tested, depending on the output data of the SRAM 42. After all of the device select data are used for device selection, the counter 40 is returned to its initial state upon receiving the reset signal R.

The pattern of the device selection signals $S_0, S_1, \ldots S_n$ are determined by the data signals $D_0, D_1, \ldots D_n$ delivered to the data buffer 45 and the address signals $A_0, A_1, \ldots A_n$ delivered to the SRAM 42. The system controller 12 determines the values of the data signals and the address signals based on the test patterns generated by the test pattern generator 14.

Figure 4:
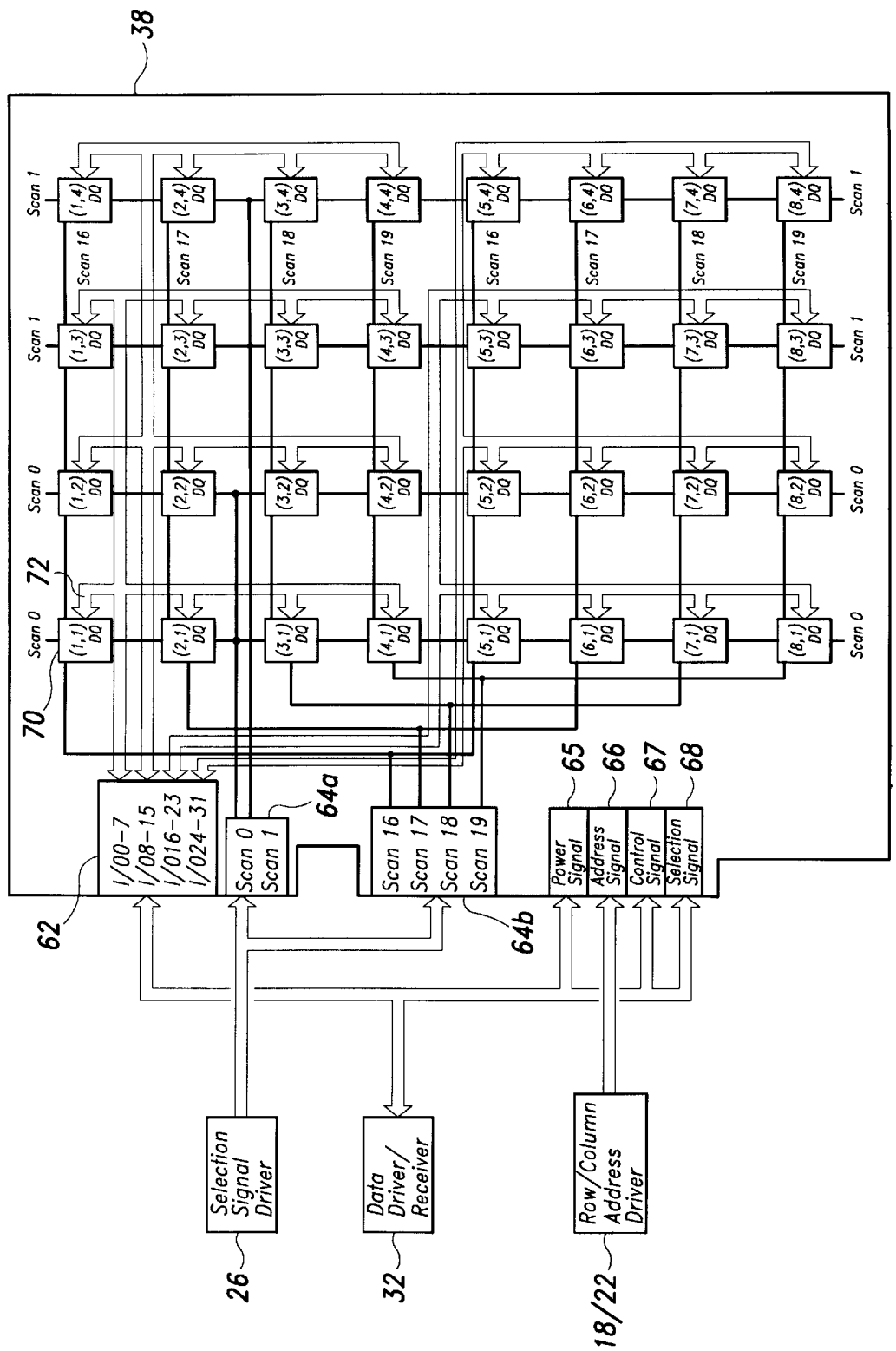
FIG. 4 shows the connections between the devices mounted on a test board and scanning signals for selecting the devices.

FIG. 4 shows the connections between the devices mounted on the test board 38 and the scanning signals for selecting the devices. The test board 38 shown in FIG. 4 has a configuration disclosed in the above-mentioned U.S. Pat. application Ser. No. 08/967,016, filed Nov. 10, 1997, entitled "TEST BOARD FOR TESTING IC DEVICES OPERATING IN MERGED DATA OUTPUT MODE OR STANDARD MODE"(Attorney Docket No. SEC.351). With this test board it is possible to test, by using just one test board, devices operating in both the merged data output mode and the normal standard mode.

The test board 38 has, e.g., 32 sockets into which IC devices 70 to be tested are inserted. Each of the devices 70 has, e.g., 8 DQ terminals for data input and output, and the test board 38 has 32 input/output (I/O) pins 62. The scanning signals 0, 1, and 16–19 enable certain devices of the 32 devices, and are connected to the selection signal driver 26. Address signals 66 are provided by the row address driver 18 and the column address driver 22. I/O signal 62, power supply signal 65, control signal 67, and mode selection signal 68 are connected to the data driver/receiver 32, so that the test system can provide test signals to the devices 70 and read output signals from the devices 70.

The power supply signal 65, the address signal 66, the control signal 67, and the mode selection signal 68 are all connected to each of the 32 devices, but the connections are not shown in FIG. 4 for simplicity. The control signal 67 controls the operation of the device and comprises RAS (Row Address Strobe), CAS (Column Address Strobe), WE (Write Enable), and OE (Output Enable) control signals. The mode selection signal 68 is used to select whether the memory device 70 operates in the normal standard mode or in the merged data output mode.

The operational modes of the devices are determined by the test system. In the merged data output mode, the device 70 outputs its 8 bit output data through certain merged data output terminals, for example, through DQO and DQ7. For instance, if the device is an 8M by 8 (64M) memory device, in which one bit data is output from each of the 8M memory blocks, the two most significant bits, e.g., Y11 and Y12, of the address signals are not considered in the merged data output. Accordingly, four 8M memory blocks having the same address bits (e.g., X0–X12 and Y0–Y10) except the most significant bits (e.g., Y11 and Y12) provide their 4 bit output data via one of the merged data output terminals (DQ0 or DQ7). For example, when data '1' is written to all of the memory cells and then data is read from the memory cells, the correct data '1'is output from the DQ0 terminal only when four data bits from the memory cells in the four 8M memory blocks all have data '1'values. If at least one 8M memory block has a defective cell such that the data output has a false '0 ' value, output data from the DQ0 terminal will be '0 ', which signifies that the memory device has a defect.

The scanning signal 'scan 0' (64a) enables memory devices in the first and the second columns of the test board 38 and the scanning signal 'scan 1'(64a) enables memory devices in the third and the fourth columns of the thirty two memory devices 70 arranged in the matrix form. Meanwhile, the row enable scanning signals 'scan '16, scan 17, scan 18, and scan 19' (64b) enable the memory devices 70 located, respectively, in the first/fifth rows, second/sixth rows, third/ seventh rows, and fourth/ eighth rows. When both the row scanning signals 64a and the column scanning signals 64b are active, the device 70 at the intersection produces output data. For example, if the 'scan 0' signal of the column scanning signals 64a and the 'scan 16' signal of the row scanning signals 64b are active, output data can be read through the DQ terminal coming from the devices (1,1), (1,2), (5,1), and (5,2). Different scanning signals may be allocated to chose specific columns and rows for outputting data. In general, however, if the scanning signals are 32 bits, scan 0 to 15 are used for column selection and scan 16 to 31 are used for row selection.

The 32 I/O pins 62 of the test board 38 are electrically connected to the DQ terminals of the devices by a wiring pattern 72. The wiring pattern 72 must be designed such that the output data coming from different devices do not conflict when delivered to the I/O pins 62. For example, in FIG. 4, I/O pins numbered 0–7 are connected to the devices (1,1), (2,1), (3,1), (4,1), (1,3), (2,3), (3,3), and (4,3), I/O pins 8–15 are connected to the devices (1,2), (2,2), (3,2), (4,2), (1,4), (2,4), (3,4), and (4,4) I/O pins 16–23 are connected to the devices (5,1), (6,1), (7,1), (8,1), (5,3), (6,3), (7,3), and (8,3), and I/O pins 24–31 are connected to the devices (5,2), (6,2), (7,2), (8,2), (5,4), (6,4), (7,4), and (8,4).

With this single test board 38, both the merged data output mode operation and the standard normal mode of operation can be tested. To implement the test, it is required to produce flexible or adjustable device selection signals depending on the operational mode of the devices, i.e., the test pattern for the devices. Table 1 below shows the patterns of the device selection signals, i.e., the scanning signal patterns for the test.

TABLE 1

Device Selection Signal Patterns

| | Device Selection Signal (Scanning Signal) | | | | | | Operation | |
|---|---|---|---|---|---|---|---|---|
| | 0 | 1 | 16 | 17 | 18 | 19 | Mode | Selected Devices |
| Pattern 1 | 1 | 0 | 1 | 1 | 1 | 1 | Merged DQ | (1,1)–(8,1) (1,2)–(8,2) |
| Pattern 2 | 0 | 1 | 1 | 1 | 1 | 1 | Merged DQ | (1,3)–(8,3) (1,4)–(8,4) |
| Pattern 3 | 1 | 0 | 1 | 0 | 0 | 0 | Standard | (1,1) (1,2) (5,1) (5,2) |
| Pattern 4 | 1 | 0 | 0 | 1 | 0 | 0 | Standard | (2,1) (2,2) (6,1) (6,2) |
| Pattern 5 | 1 | 0 | 0 | 0 | 1 | 0 | Standard | (3,1) (3,2) (7,1) (7,2) |
| Pattern 6 | 1 | 0 | 0 | 0 | 0 | 1 | Standard | (4,1) (4,2) (8,1) (8,2) |
| Pattern 7 | 0 | 1 | 1 | 0 | 0 | 0 | Standard | (1,3) (1,4) (5,3) (5,4) |
| Pattern 8 | 0 | 1 | 0 | 1 | 0 | 0 | Standard | (2,3) (2,4) (6,3) (6,4) |
| Pattern 9 | 0 | 1 | 0 | 0 | 1 | 0 | Standard | (3,3) (3,4) (7,3) (7,4) |
| Pattern 10 | 0 | 1 | 0 | 0 | 0 | 1 | Standard | (4,3) (4,4) (8,3) (8,4) |

In Table 1, the scanning signals are in their active states when they have a logic '1' value, while the scanning signals are inactive when they are logically Therefore, if, e.g., the scan 0 signals is '1', devices located in the first and the second columns can be selected.

As described previously, two bits of data are output from terminals DQ0 and DQ7 of each device in the merged data output mode. Since there are thirty two I/O pins 62 of the test board 38, sixteen devices can be selected by the scanning signals at one time in this merged data output mode. This general relationship can be stated by the formula d=(m/p), where 'd' is the number of devices that can be selected for testing at one time, 'm' is the number of I/O pins 62 of the test board 38 and 'p' is the number of merged data output terminals of the device. Note that the variable 'p' is less than a variable 'n', which is the number of data output terminals of the device. Therefore, the output data from all 32 devices can be checked by alternately activating the scan 0 and scan 1 signals while maintaining the scan 16 to scan 19 signals in an active state, as shown in Patterns 1 and 2 of Table 1.

On the other hand, since 8 bits of data are output from terminals DQ0 through DQ7 of each device in the standard normal mode, four devices can be selected by the scanning signals at one time using thirty two I/O pins 62. This general relationship can be stated by the formula d= (m/n), where 'd' is the number of devices that can be selected for testing at one time, 'm' is the number of I/O pins 62 of the test board 38 and 'n' is the number of data output terminals of the device. Accordingly, as shown by Patterns 3 to 10 of Table 1, it is possible to check the output data of all 32 devices by alternately making one of the scan 0 and scan 1 signals active, and then sequentially activating each one of the scan 16 to scan 19 signals. By using these scanning patterns, the failure of a specific device can be traced using the data from the output terminal.

The patterns of the scanning signals are determined by choosing the data signals and address signals supplied from the selection signal generator 24, which is controlled by the controller 12 of the test system 10. As described previously, the selection signal generator 24 of the test system receives microprogram addresses from the test pattern generator 14 which is also controlled by the system controller 12, so that the selection signal patterns can be adjusted according to standard memory test patterns or user defined test patterns.

While this invention has been described with reference to illustrative embodiments, the scope of the invention is not limited thereto. Various modifications and combinations of the illustrative embodiments, as well as other embodiments of this invention, will be apparent to persons skilled in the art upon reference to the description. It is therefore intended that the appended claims encompass any such modifications or embodiments.

what is claimed is:

1. A test system for detecting integrated circuit device failures, the test system comprising:
   a chamber containing a test board, the chamber having a temperature controller for controlling a temperature within the chamber for applying thermal stress to a plurality of integrated circuit (IC) devices which are mounted onto the test board;
   a test pattern generator for applying electrical stress to the IC devices and for producing a predetermined test pattern to test functions of the IC devices;
   a data driver/receiver for supplying data to the IC devices and for receiving output data from the IC devices;
   a data checking unit for checking whether the output data received by the data driver/receiver has a correct value;
   a selection signal generator for producing selection signals to select the IC devices for testing, wherein at least two of the IC devices mounted on the test board are randomly selected depending on the predetermined test pattern generated by the test pattern generator; and
   a controller for controlling operations of the temperature controller, the test pattern generator, the data driver/receiver, the data checking unit, and the selection signal generator.

2. The test system of claim 1, the selection signal generator comprising
   a memory device for writing external data into memory cells indicated by address signals and for reading the written external data as the selection signals; and
   a counter for sequentially increasing the address signals entering into the memory device.

3. The test system of claim 2, wherein the external data and the address signals of the selection signal generator is provided by the controller based on the predetermined test pattern.

4. The test system of claim 2, wherein the memory device has address input terminals to which the address signals and output signals of the counter are provided, and wherein the output signals of the counter enter the memory device via the address input terminals when the memory device outputs the written external data.

5. The test system of claim 2, wherein the counter has as input signals an enable signal for driving the counter, a reset signal for resetting the counter to its initial state, and an increment signal for sequentially increasing the output signal of the counter.

6. The test system of claim 1, the test board comprising:
   a plurality of sockets to which the corresponding plurality of IC devices are inserted;
   a plurality of input/output (I/O) pins connected to the data driver/receiver;
   mode selection signal pins connected to the data driver/receiver for selecting an operational mode of the IC devices, the operation mode being one of a merged data output mode and a standard normal mode;
   control signal pins connected to the data driver/receiver for controlling functions of the IC devices;
   wiring patterns for electrically connecting data output terminals of each of the IC devices and the I/O pins, wherein predetermined merged output terminals containing merged output data of the IC device are sequentially connected to the I/O pins when the IC devices are operated in the merged data output mode, and wherein the output data terminals containing standard output data of the IC devices are sequentially connected to the I/O pins when the IC devices are operated in the standard normal mode; and
   selection signal input pins connected to the selection signal generator.

7. The test system of claim 6, wherein the plurality of sockets containing the IC devices are arranged in a row and column matrix, and wherein an IC device is enabled when corresponding row selection signals and column selection signals are in active states.

8. The test system of claim 7, wherein the number of IC devices simultaneously enabled by the row selection signals and the column selection signals in the standard normal mode is determined by a formula (m/n), where 'm' is a number of I/O pins of the test board and 'n' is a number of data output terminals.

9. The test system of claim 7, wherein the number of IC devices simultaneously enabled by the row selection signals and the column selection signals in the merged data output mode is determined by a formula (m/p), where 'm' is a number of I/O pins of the test board and 'p' is a number of merged data terminals.

10. The test system of claim 9, wherein 'n' is a number of data output terminals and 'n' is greater than 'p'.

11. The test system of claim 7, wherein the column address signals are alternatively activated and deactivated while the row selection signals are maintained in an active state when the test system operates in the merged data output mode.

12. The test system of claim 7, wherein each column address signal is maintained in an active state while the row selection signals are sequentially activated and deactivated when the test system operates in the standard normal mode.

* * * * *